US011094872B2

(12) United States Patent
Ahdoot et al.

(10) Patent No.: US 11,094,872 B2
(45) Date of Patent: Aug. 17, 2021

(54) APPARATUS FOR THERMOELECTRIC GENERATION ON HVAC PIPES

(71) Applicants: Eliot Ahdoot, Dollard-des-Ormeaux (CA); Benjamin Ahdoot, Dollard-des-Ormeaux (CA); Simon Ahdoot, Toronto (CA)

(72) Inventors: Eliot Ahdoot, Dollard-des-Ormeaux (CA); Benjamin Ahdoot, Dollard-des-Ormeaux (CA); Simon Ahdoot, Toronto (CA)

( * ) Notice: Subject to any disclaimer, the term of this patent is extended or adjusted under 35 U.S.C. 154(b) by 547 days.

(21) Appl. No.: 15/148,762

(22) Filed: May 6, 2016

(65) Prior Publication Data

US 2016/0329480 A1    Nov. 10, 2016

Related U.S. Application Data

(60) Provisional application No. 62/158,759, filed on May 8, 2015.

(51) Int. Cl.
*H01L 35/32* (2006.01)
*H01L 35/30* (2006.01)

(52) U.S. Cl.
CPC .............. *H01L 35/32* (2013.01); *H01L 35/30* (2013.01)

(58) Field of Classification Search
CPC ................................ H01L 35/32; H01L 35/30
USPC ................................................ 136/243–265
See application file for complete search history.

(56) References Cited

U.S. PATENT DOCUMENTS

| | | | |
|---|---|---|---|
| 3,908,393 | A | 9/1975 | Eubank |
| 4,404,814 | A | 9/1983 | Beasley et al. |
| 5,377,500 | A | 1/1995 | Yang |
| 5,787,722 | A | 8/1998 | Jenkins |
| 6,595,011 | B1 | 7/2003 | Forgy |
| 6,761,039 | B1 | 7/2004 | Gray |
| 2007/0283711 | A1 | 12/2007 | Steinriede |
| 2010/0307176 | A1 | 12/2010 | Zeweke |
| 2011/0232859 | A1 | 9/2011 | Vo |
| 2012/0125027 | A1 | 5/2012 | Echols |
| 2016/0293821 | A1* | 10/2016 | Ellison ................... H01L 35/32 |

FOREIGN PATENT DOCUMENTS

CN    201880629    6/2011

* cited by examiner

*Primary Examiner* — Dustin Q Dam
(74) *Attorney, Agent, or Firm* — Benoit & Cote Inc.; Charles-André Caron

(57) ABSTRACT

There is described an apparatus for converting heat dissipated from a pipe of a refrigeration cycle into electric power. The pipe has an outer surface from which heat dissipates. The apparatus comprises at least one TEG receptacle for installing a thermoelectric generator therein, the TEG receptacle comprising a cold side and a hot side. The apparatus further comprises at least one conductive body in thermal contact with at least a portion of the outer surface of the pipe and adapted to conduct the heat from the outer surface of the pipe to the hot side of at least one TEG receptacle. The apparatus further comprises one heat sink for each one of the at least one TEG receptacle, in thermal contact with the cold side thereof.

11 Claims, 13 Drawing Sheets

APPARATUS FOR THERMOELECTRIC GENERATION ON HVAC PIPES

CROSS-REFERENCE TO RELATED APPLICATIONS

This application claims priority from U.S. provisional patent application No. 62/158,759 filed on May 8, 2015.

BACKGROUND

(a) Field

The subject matter disclosed generally relates to heat conversion devices. More specifically, it relates to devices for converting heat dissipated from a refrigeration cycle into electric power.

(b) Related Prior Art

Thermodynamic refrigeration cycles, such as the cycles used in a refrigerator or for air conditioning, or simply various thermodynamic cycles used in HVAC systems, are required to dissipate heat at some point in the cycle, according to the principles underlying those systems. Heat dissipation cannot simply be reduced since it needs to take place: it is viewed as a necessary evil. Unfortunately, once this heat is diluted into the environment, it is lost and cannot be used anymore.

Given the high energy consumption of those systems, more particularly of HVAC systems which contribute to a substantial portion of the maintenance cost of a building, recuperation of the dissipated heat before it is lost in the environment can be viewed as a way to reduce the net energy consumption of those systems.

Thermoelectric converters are devices which are, by nature, suitable for directly converting a heat flow into electric power. However, due to various losses and inevitable imperfections, they are usually suitable when high temperature differences are provided. For example, when a surface has a temperature more than 200 K above the room temperature, thermoelectric converters can be considered.

This is why the only thermodynamic systems on which thermoelectric converters are known to have been are those in which high temperature differences exist. For example, US20040045594A1 describes a thermoelectric generator located at the exhaust of a turbine which burns fuel. U.S. Pat. No. 6,053,163A describes incorporating a thermoelectric generator on a stovepipe having a combustion chamber.

As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

SUMMARY

According to an embodiment, there is provided an apparatus for converting heat dissipated from a pipe of a refrigeration cycle into electric power, the pipe having an outer surface from which heat dissipates, the apparatus comprising:

a thermoelectric generator (TEG) receptacle for installing a thermoelectric generator therein, the TEG receptacle comprising a cold side and a hot side;

a conductive body in thermal contact with at least a portion of the outer surface of the pipe and adapted to conduct the heat from the outer surface of the pipe to the hot side of the TEG receptacle; and a heat sink in thermal contact with the cold side the TEG receptacle.

According to an aspect, the TEG receptacle comprising two or more TEG receptacles, wherein the conductive body comprises two or more conductive bodies and wherein there is one heat sink for each the two or more TEG receptacles.

According to an aspect, the apparatus further comprises an attachment ensuring an intimate contact between the two or more conductive bodies and the outer surface of the pipe.

According to an aspect, the attachment further provides an intimate contact between adjacent ones of the two or more conductive bodies.

According to an aspect, the apparatus further comprises a thermoelectric generator installed in each one of the two or more TEG receptacles.

According to an aspect, each one of the two or more TEG receptacles comprises a pair of channels for letting electric wires pass therethrough.

According to an aspect, the two or more conductive bodies comprises two conductive bodies, the pipe being sandwiched between the two conductive bodies which, together, substantially surround the outer surface of the pipe.

According to an aspect, each one of the two conductive bodies is in thermal contact with one of the two or more TEG receptacles which is in thermal contact with one heat sink.

According to an aspect, the attachment further provides an intimate contact between the two conductive bodies, which assists in firmly sandwiching the pipe therebetween.

According to an aspect, the two or more conductive bodies provide four surfaces on which the two or more TEG receptacles can be mounted.

According to an aspect, the two or more conductive bodies comprise four conductive bodies, each one of the four conductive bodies providing one of the four surfaces on which the two or more TEG receptacles can be mounted.

According to an aspect, the attachment further provides an intimate contact between the two or more conductive bodies, which assists in firmly sandwiching the pipe therebetween.

According to an aspect, the attachment comprises at least one of a screw and a pin, the attachment being inserted through one of the heat sinks, through the two or more TEG receptacles and through at least two of the two or more conductive bodies.

According to an aspect, the conductive body comprises only one conductive body that surrounds a portion of the outer surface of the pipe, the TEG receptacle comprising one space provided between the conductive body and the heat sink, the apparatus further comprising a conductive strip that coats a remaining portion of the outer surface of the pipe to conduct the heat from the remaining portion of the outer surface of the pipe to the conductive body.

According to an aspect, the apparatus further comprises a fastener to provide an intimate contact between the conductive body and the conductive strip, thereby sandwiching the pipe therebetween.

According to an aspect, the fastener comprises at least one of a screw, a clamp, and a clip.

According to an aspect, the conductive body comprises only one conductive body that surrounds a portion of the outer surface of the pipe, the conductive body comprising two arms, the TEG receptacle comprising two TEG receptacles mounted on each one of the two arms of the conductive body, the apparatus further comprising thermal paste that coats a remaining portion of the outer surface of the pipe to conduct the heat from the remaining portion of the outer surface of the pipe to the conductive body.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

There are disclosed herein embodiments of an apparatus for converting heat dissipated from the pipes of HVAC systems or refrigeration systems into electric power.

It is well known from the field of thermal engineering that thermodynamic cycles used for refrigeration and air conditioning include a step of heat dissipation from the system. This heat dissipation typically occurs at the condenser of the system. For example, the serpentines (coils) behind a commercial refrigerator are a condenser through which heat is dissipated (by radiation, convection or conduction through the air). HVAC systems in commercial and industrial buildings also have a condenser, typically larger than the condenser of a refrigerator, through which heat is dissipated.

Therefore, heat capture and conversion can be considered for decreasing the overall (net) energy consumption of various types of refrigeration systems. This conversion may be performed at locations where the conditions are consistent for the thermodynamic cycle underlying the refrigeration system, i.e., directly at the condenser, or just before the condenser, when the refrigerating fluid has the highest temperature after having been compressed by a compressor.

An apparatus can be installed at at least one of these locations for capturing heat originating from the pipe of the HVAC/refrigeration system and converting it to electric power.

The conversion from heat flow to electric power is made by a thermoelectric converter, also known as a thermoelectric generator. This conversion uses the Seebeck effect, according to which a properly chosen material combination, when exposed to a temperature gradient, undergoes charge separation and therefore generates a voltage between parts of the device. The device is usually sold either as a Seebeck or as a Peltier converter, since both effects are reciprocal. The device is usually thin (small thickness), flat (substantially smooth and regular surface, with the same thickness) and rectangular, although other shapes and irregularities may exist. This usual shape defines two sides: a side which is to receive heat, i.e., the hot side, and a side which is to emit residual heat, i.e., the cold side. The heat is conducted through the thickness of the device from the heat side to the cold side, and a fraction of this heat is directly converted to a voltage under the Seebeck effect. The fraction of heat converted is directly proportional to the temperature difference between the hot and the cold sides, and also depends on the Seebeck coefficients of the materials used in the device.

Figure 1:
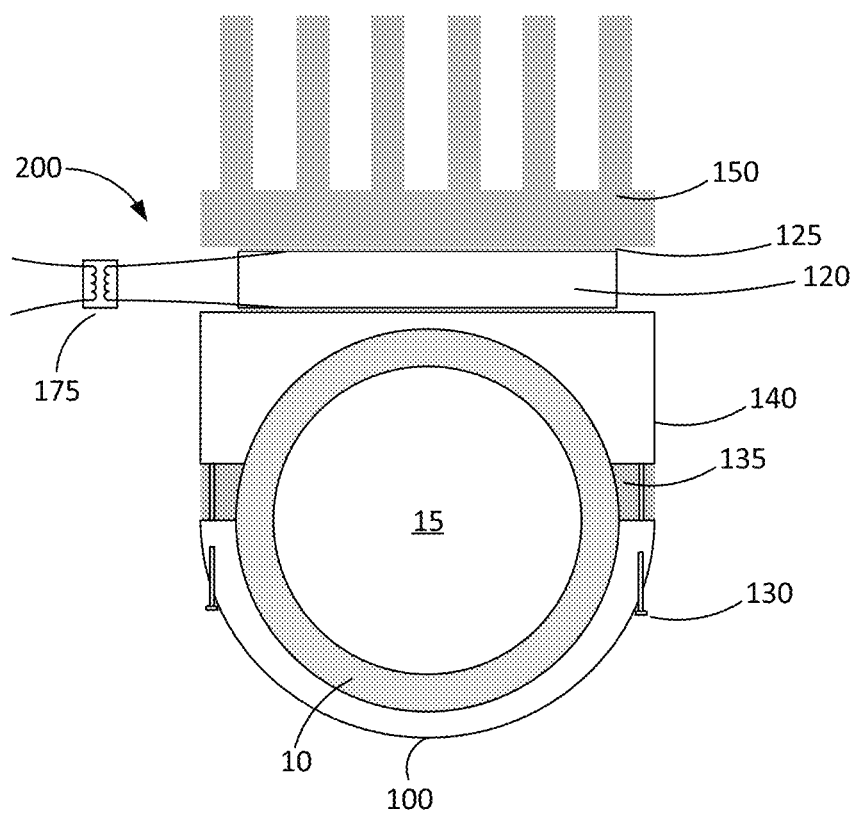
FIG. 1 is a cross-section view illustrating an apparatus for converting heat dissipated from a pipe into electric power using thermal paste for heat conduction between conducting surfaces, according to an embodiment.

Referring now to the drawings, and more particularly to FIG. 1, a cross-section view illustrates an embodiment of such an apparatus 200.

FIG. 1 shows a cross-section of a pipe 10. A fluid 15 circulates within the pipe 10. The pipe 10 is part of a refrigeration system or otherwise a HVAC (Heating, Ventilation, and Air Conditioning) system, and the fluid 15 is a refrigerant or any other fluid that is suitable for heat transport in such systems. When the fluid 15, which has a fluid temperature exceeding the ambient temperature, circulates within the pipe 10, there is an outward heat flow. Heat is transmitted to the inside surface of the pipe 10.

This heat is virtually instantaneously transmitted to the outside surface of the pipe 10, since the pipe 10 is usually made of a material of a high thermal conductivity, such as copper or an alloy thereof. Therefore, there is a heat flow conducted to the outside surface of the pipe 10 which can be captured.

FIG. 1 further shows a conductive strip 100 for coating the outside surface of the pipe 10, or at least a portion thereof. Usually, the pipe 10 has a circular cross-section, and a thermoelectric generator 120, described below, is provided by the pipe 10, which causes some space around the pipe 10 to become unavailable for wrapping a strip therearound.

Therefore, the conductive strip 100 surrounds only the remaining portion which is available for coating, as can be seen in FIG. 1.

The conductive strip 100 may take various forms depending on the embodiment. For example, the conductive strip 100 may comprise a foil or sheet that is wrapped around the pipe 10, or a solid metallic piece shaped (i.e., machined) as to effectively surround the pipe 10 (e.g., a curved metal plate). According to an embodiment, the conductive strip 100 is an aluminum sheet, which possesses the necessary thermal properties.

As mentioned above, a thermoelectric generator 120 is provided for receiving heat originating from the pipe 10. The thermoelectric generator 120 is used for converting heat flow into electric power, which can be outputted and used for various purposes.

According to an embodiment, the thermoelectric generator 120 is in indirect thermal contact with the pipe 10 for receiving heat therefrom. The thermoelectric generator is also in indirect thermal contact with the conductive strip 100 for receiving heat therefrom.

To provide these indirect thermal contacts, the upper portion of the pipe 10 is surrounded by a conductive body 140, which is used to hold various parts together and to provide thermal communication between these various parts. More specifically, the conductive body 140 supports the thermoelectric generator 120 and conducts heat from the pipe 10 and from the conductive strip 100 to the thermoelectric generator. As mentioned above, commercially available thermoelectric generators 120 are usually shaped as a thin rectangle. The conductive body 140 is a solid piece having a flat surface on the top to provide support for the thermoelectric generator. The conductive body 140 need not surround sides of the thermoelectric generator, since the thermoelectric generator 120 is preferably connected with electric wires which need to exit the apparatus to be connected elsewhere, where some electric power can be delivered. As for the conductive strip 100, the conductive body 140 is either machined to have a shape matching the upper portion of the pipe 10, or is made of foils or of a flexible material in order to substantially adopt that shape (i.e., a semi-circular shape).

Therefore, even though the pipe 10 has a circular cross-section and the thermoelectric generator 120 has a substantially flat and rectangular shape, the thermoelectric generator 120 is now made to receive a substantial fraction of the heat flow emanating from the whole outer surface of the pipe 10, thanks to the conductive strip 100 which brings most of the heat flow, which would otherwise have dissipated into the environment, to the hot side of the thermoelectric generator 120.

There is further provided an attachment 130 to attach the conductive strip 100 to the conductive body 140 and to sandwich firmly the pipe 10 between them (i.e., completely surround the circumference of the pipe 10).

The attachment 130 provides a solid or firm attachment to the conductive body 140. The firm attachment is used to maintain a close or intimate contact between the conductive strip 100 and the outer surface of the pipe 10.

Figure 3:
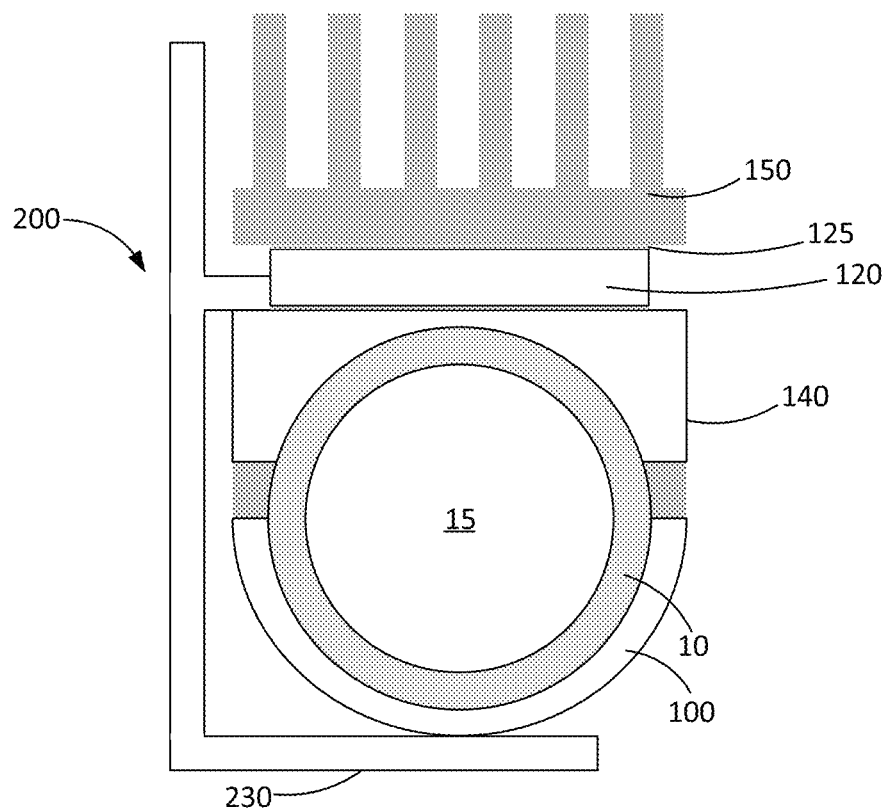
FIG. 3 is a cross-section view illustrating an apparatus for converting heat dissipated from a pipe into electric power using a clamp for providing intimate contact between conducting surfaces, according to an embodiment.
Figure 4:
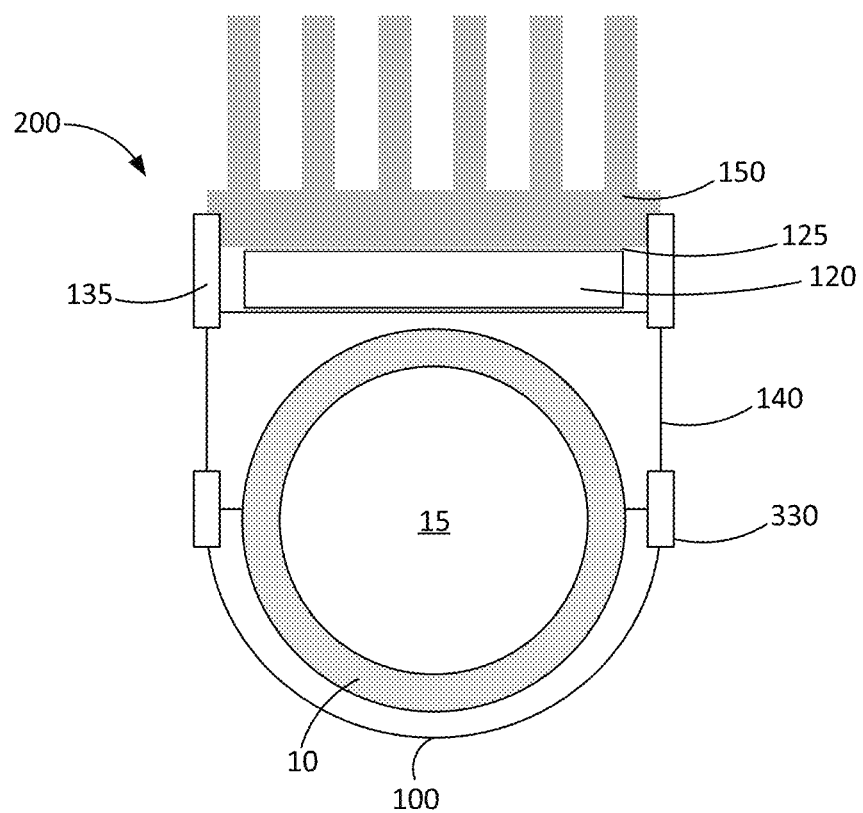
FIG. 4 is a cross-section view illustrating an apparatus for converting heat dissipated from a pipe into electric power using a fastener for providing intimate contact between conducting surfaces, according to an embodiment.

According to an embodiment, the attachment 130, used to provide the intimate contact between surfaces, comprises screws. According to another embodiment specifically illustrated in FIG. 3, the attachment 230 comprises clamps. According to another embodiment of the apparatus 200 specifically illustrated in FIG. 4, the attachment 330 comprises fasteners. In order to prevent heat to be conducted through the attachment (130, 230, 330) to either the conductive body 140 or to the environment, the attachment (130, 230, 330) can designed to have low thermal conductivity. According to an embodiment, the attachment (130, 230, 330) is made of galvanized steel to reduce heat conduction therethrough. Other insulating materials or coatings may be used.

Presence of air or any other fluid or impurity causes thermal conduction to dramatically decrease between the outer surface of the pipe 10 and the inner surface of the conductive strip 100. If one aims at optimizing the heat transfer between these surfaces, an intimate contact between them is required. Otherwise, the use of an intermediate conductive substance that would fill air gaps between surfaces, such as thermal adhesive or thermal grease, is possible, although not preferable.

Figure 2:
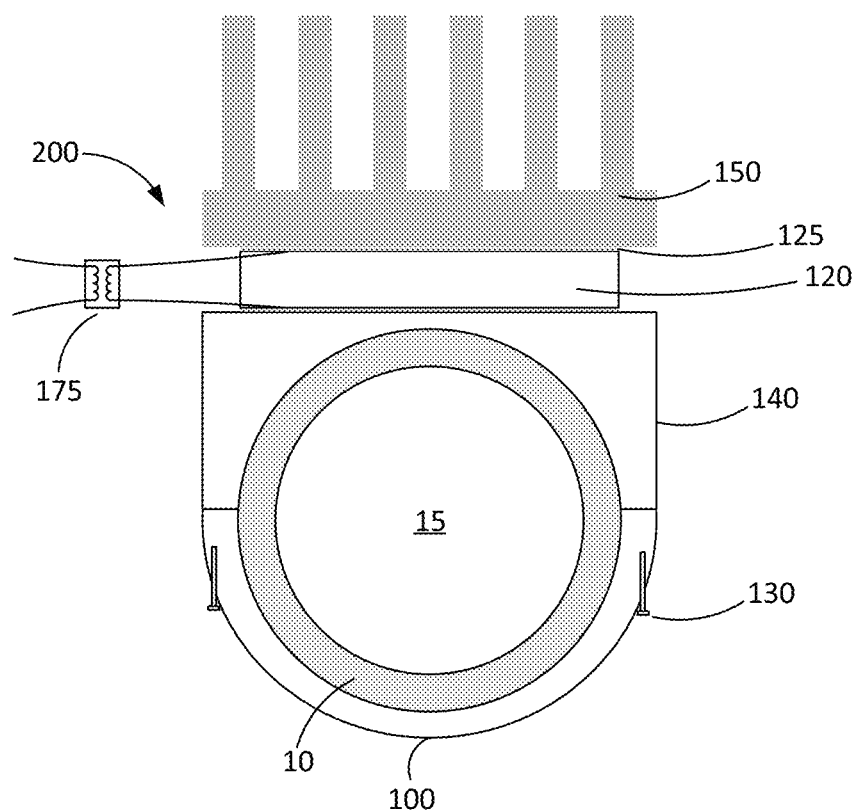
FIG. 2 is a cross-section view illustrating an apparatus for converting heat dissipated from a pipe into electric power wherein conducting surfaces are in direct contact, according to an embodiment.

As shown in FIG. 1, thermal paste 135 is used to fill the gap between the conductive strip 100 and the conductive body 140 to ensure heat conduction from the former to the latter. Other suitable space-filling heat conductors can be used. According to another embodiment shown in FIG. 2, the conductive strip 100 is made to directly contact the conductive body 140 to ensure proper heat conduction. In this case, the attachment (130, 230, 330) also has a role of providing intimate contact between these conductive surfaces so that heat conduction is optimal, since gaps decrease efficiency. Either configurations (thermal paste or intimate contact between the conductive strip 100 and the conductive body 140) are possible for the disclosed variants (screws, clamps, fasteners, clips, etc.), even though some combinations might not be illustrated.

There is further provided a heat sink 150 for dissipating the remaining heat flow into the environment. Since only a fraction of the heat flow is converted into electric power by the thermoelectric generator 120, the remaining fraction of the heat flow is conducted through the thermoelectric generator 120 to the cold side thereof. Leaving the cold side of the thermoelectric generator exposed to the environment (i.e., to the atmosphere) is possible, although not preferable since the air is not efficient for heat transport. Heat sinks are usually made of a material having very high heat conduction properties and have fins or other structures which increase the surface of the device with the atmosphere to increase at least one of radiation and convection for dissipating heat.

It is preferable to install a heat sink 150 on the cold side of the thermoelectric generator to ensure proper heat dissipation of the cold side to keep it relatively colder than the hot side of the thermoelectric generator. Therefore, it will be understood that the heat sink 150 plays a role in keeping a proper temperature gradient in the thermoelectric generator. The higher the temperature gradient, the more important the heat flow through the thermoelectric generator 120 becomes, and the more significant the electric conversion of heat into electric power becomes.

According to an embodiment, thermal paste or grease 125 is provided on the surfaces of the thermoelectric generator 120. It ensures that air gaps are avoided and it provides attachment with the neighboring surfaces (bottom of heat sink 150, top of conductive body 140).

Therefore, the heat sink 150, by aiding in maintaining a significant temperature gradient in the thermoelectric generator 120, provides two advantages: it increases the fraction of heat flow that is converted into electric power (since this fraction is proportional to the temperature difference), and it increases the heat flow that can be extracted from the pipe 10. These two advantageous effects are combined to obtain an increased electric power as an output.

The thermoelectric generator 120 is adapted to provide a voltage between both sides thereof when it undergoes a significant temperature difference. In order to use this voltage, wires may be connected to the thermoelectric generator 120.

According to an embodiment, these electric wires are connected to a transformer 175 for converting the 5 V voltage outputted by the thermoelectric generator 120 into a 12 V that may be more conveniently used for other applications. Other types of converters may be used for various purposes.

According to an embodiment, the outputted voltage, whether it is transformed to another voltage or not, is used to feed directly an electrical apparatus (not shown), such as a battery or a charger. Feeding may be performed at the level of the plug, by plugging the electrical apparatus to a charger which is itself plugged on the wall, the charger being adapted to receive the electric power outputted from the thermoelectric generator 120 and inject it in the charger with the standard voltage used to feed the electrical apparatus. Various other configurations may be contemplated, but they are more closely related to circuitry; so these techniques will not be further described herein.

According to an embodiment, a given module could yield an electric power of about 5 W under a temperature difference of 80 to 90 K. Suboptimal embodiments yield lower efficiencies. Other embodiments might be found to have higher efficiencies under a given temperature difference.

Figure 5:
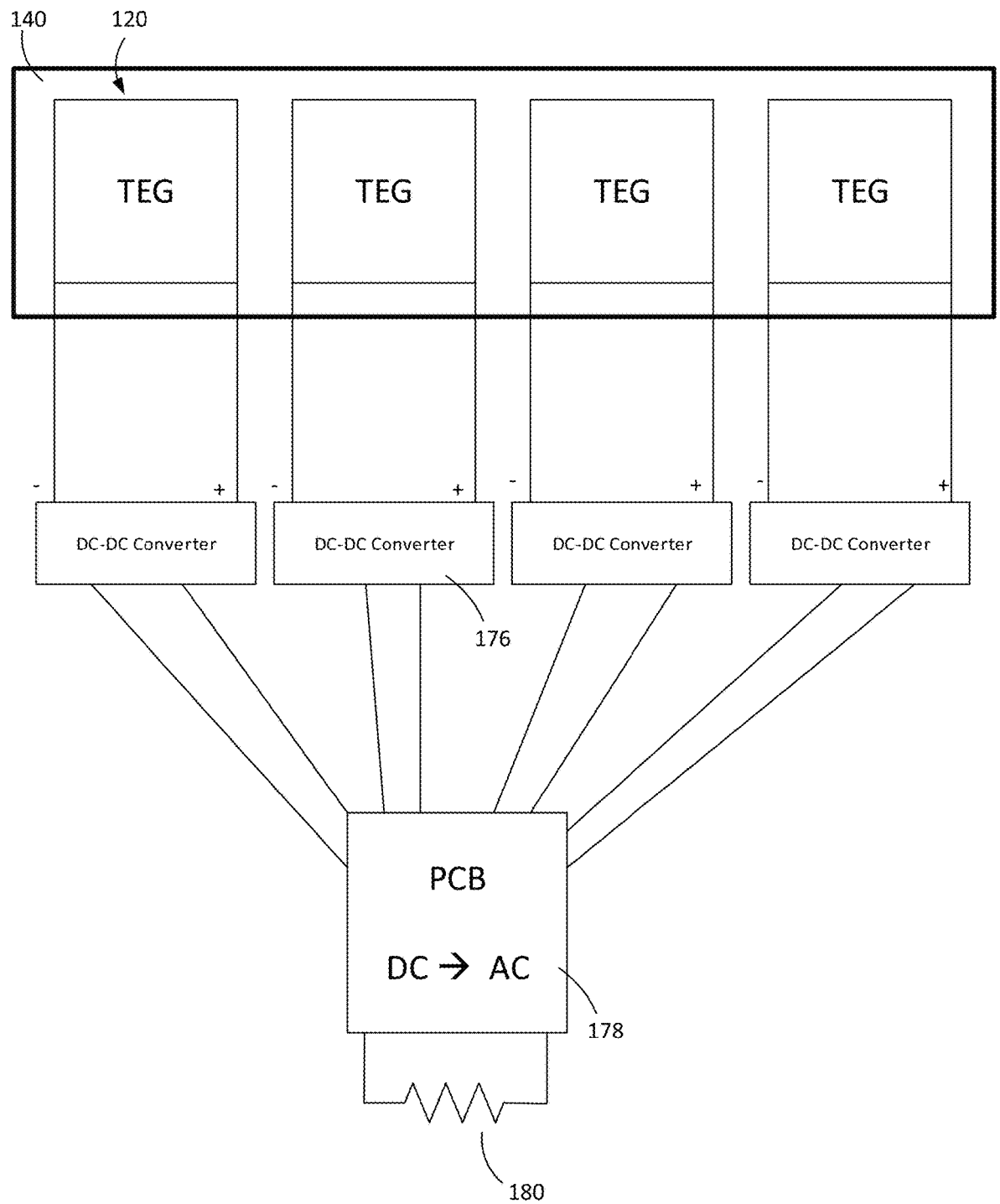
FIG. 5 is a top view illustrating a plurality of modules installed on a pipe and connected for generating electric power, according to an embodiment.

According to an embodiment, a plurality of modules can be provided on one pipe or a plurality of pipes. FIG. 5 is a top view of a pipe on which a plurality of modules are installed (heat sinks 150 are not shown). According to the illustrated embodiment, modules are installed one after the other on a single pipe. Each thermoelectric generator has wires branching out from the modules. These wires can be connected to an electric circuit. The illustrated embodiment shows thermoelectric generators 120 connected to a DC-DC converter 176 which outputs a standard voltage, such as 5V or 12V. However, other wiring configurations could be used depending on the requirements of the system. The electric power extracted from the thermoelectric generators 120 via the DC-DC converters 176 can be used to feed an AC/DC converter 178, such as a PCB (printed circuit board), to which is connected a load 180, i.e., an electric device that needs an electric power input (usually alternative current) to work.

Figure 6:
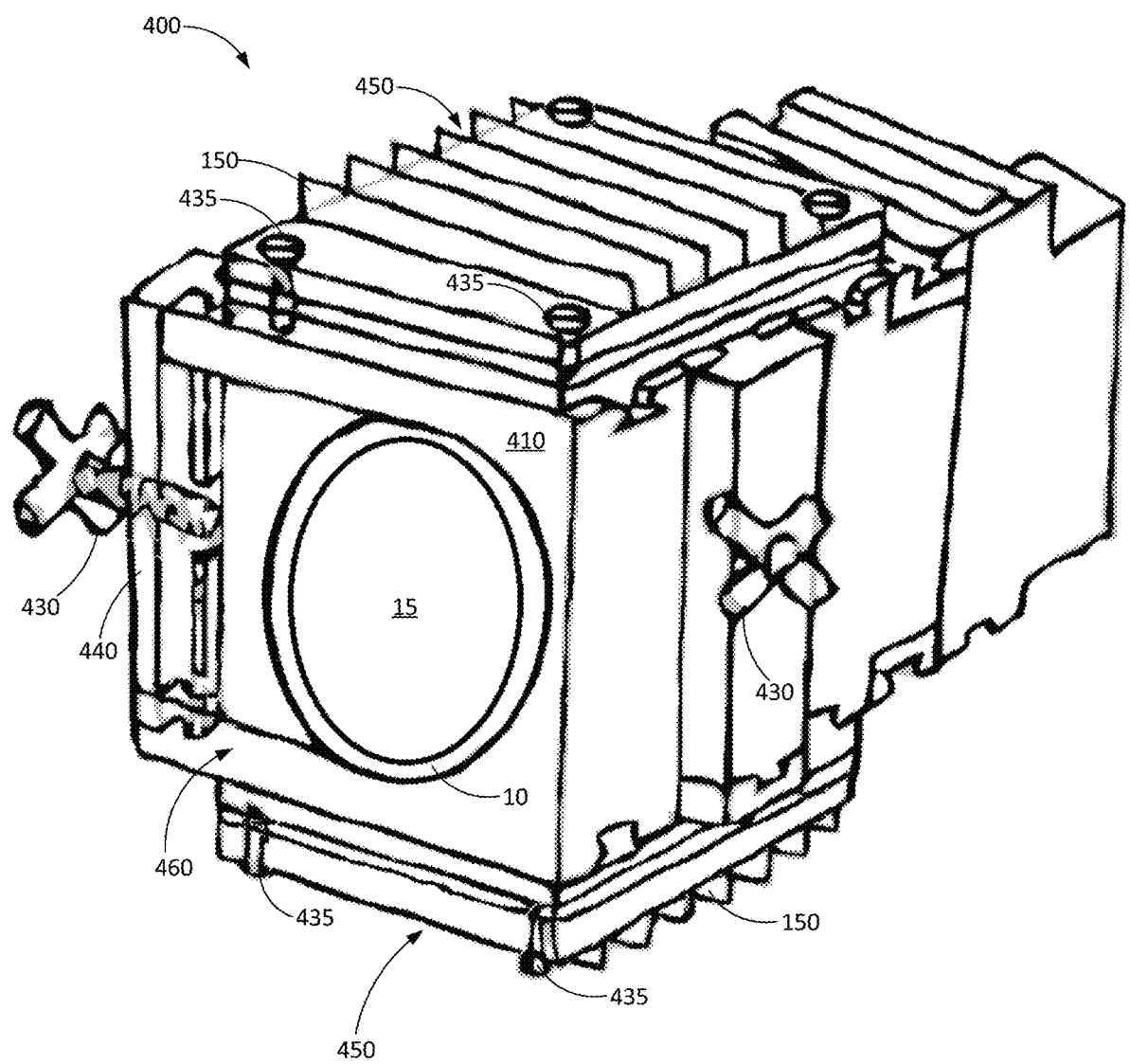
FIG. 6 is a perspective view illustrating an apparatus for converting heat dissipated from a pipe into electric power using a U-shaped conductive body with a TEG receptacle mounted on each arm of the U-shaped conductive body, according to an embodiment.
Figure 7:
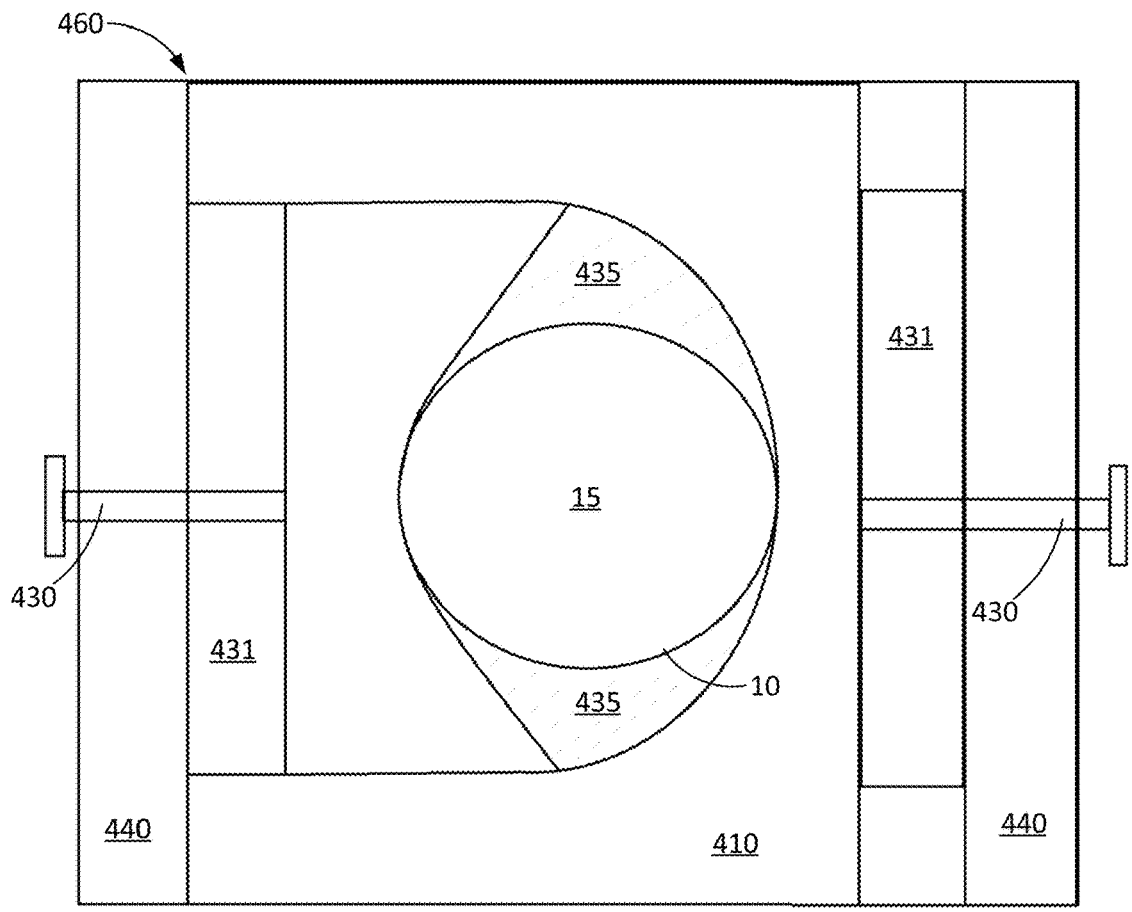
FIG. 7 is a cross-section view illustrating the apparatus of FIG. 6.
Figure 8:
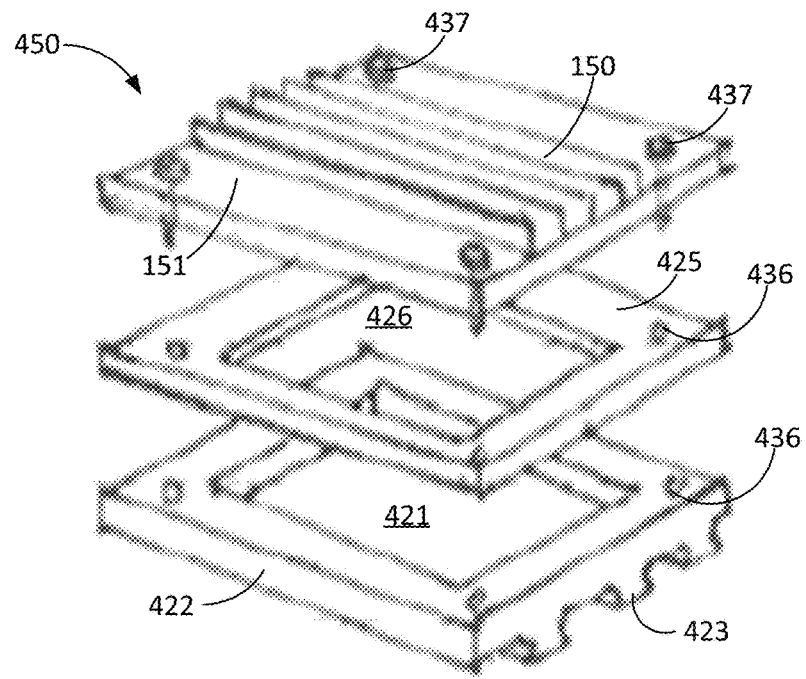
FIG. 8 is an exploded view of the heat sink mount of the apparatus of FIG. 6.

Now referring to FIGS. 6-8, there is shown another embodiment of an apparatus (apparatus 400). The apparatus 400 is to be mounted on a pipe 10 in which a fluid 15 flows. The apparatus 400 is made up of a pipe-surrounding portion 460 and of one or preferably two heat sink mounts 450. Indeed, as will be realized below, the apparatus 400 lows for a pair of heat sinks 150, and therefore a pair of thermoelectric generators 120, to be installed around the pipe 10.

FIG. 6 illustrates the pipe 10, with a fluid 15 flowing therein, with the pipe-surrounding portion 460 installed around the pipe 10. The pipe-surrounding portion 460 comprises a U-shaped conductive body 410, shown in FIGS. 6-7, which is mounted on the pipe 10 and substantially surrounds it to have heat transferred thereto from the pipe 10. The U-shaped conductive body 410 is analogous to the conductive strip 100 shown in FIGS. 1-4. The U-shaped conductive body 410 is a solid piece of a thermally-conductive material (e.g., a conductive metal) machined to contour the pipe 10. It transfers heat from the pipe 10 toward the heat sink mounts 450 via the thermoelectric generators 120.

As shown in FIG. 7, thermal paste 435 can be added around the pipe 10 to increase the heat transfer with the U-shaped conductive body 410. The U-shaped conductive body 410 comprises two arms on which the heat sink mounts 450 are mounted. The pipe-surrounding portion 460 further comprises a way to clamp everything together, such as a pair of fasteners or screws 430 which can be screwed through fastening bodies 440 to reach attachment plates 431, as shown in FIG. 7. The heat sink mounts 450 (see FIG. 8) are then mounted on the arms of the U-shaped conductive body 410 and attached to the fastening bodies 440 to form the apparatus 400 as shown in FIG. 6.

FIG. 8 shows an embodiment of a heat sink mount 450. The heat sink 150 is provided on the heat sink mount. The heat sink 150 is made up of fins or any other equivalent, installed on a heat sink base 151. This piece is attached to the pipe-surrounding portion 460 (more precisely, to the fastening bodies 440) via a fastener or attachment 437, such as screws, as shown in FIG. 8. Between the heat sink 150 and the pipe-surrounding portion 460, there are provided an insulating layer 425 and a TEG holder 422. The TEG holder 422 is a piece that holds and surrounds the thermoelectric generator 120. An opening 421 is provided within the TEG holder to receive the thermoelectric generator 120. The insulating layer 425 is a piece of thermally-insulating material that is mounted on top of the TEG holder 422 to prevent heat transfer directly from the TEG holder 422 to the heat sink 150, since most of the heat should transfer via the thermoelectric generator 120 to produce electric power. Holes 436 are provided within the TEG holder 422 and the insulating layer 425 so that the attachments 437 can pass therethrough and reach the pipe-surrounding portion 460, thereby attaching all the pieces of the heat sink mount 450 together and to the pipe-surrounding portion 460.

Figure 9:
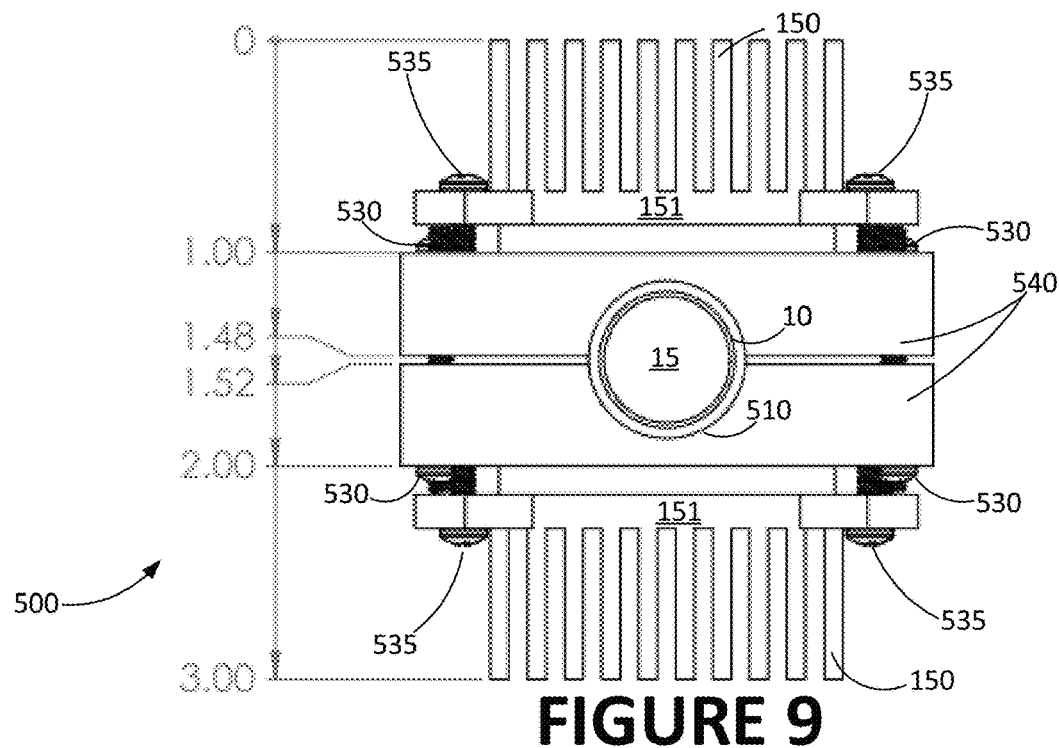
FIG. 9 is a front view illustrating an apparatus for converting heat dissipated from a pipe into electric power using two conductive bodies with a TEG receptacle mounted on each one of them, the two conductive bodies sandwiching the pipe therebetween, according to an embodiment.
Figure 10:
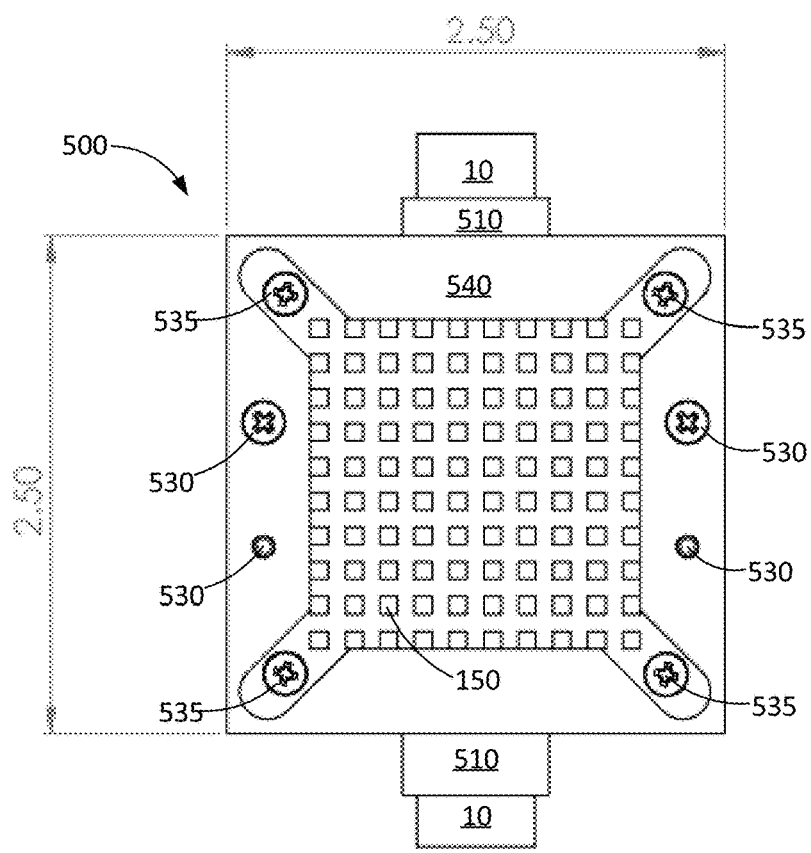
FIG. 10 is a top view illustrating the apparatus of FIG. 9.
Figure 11:
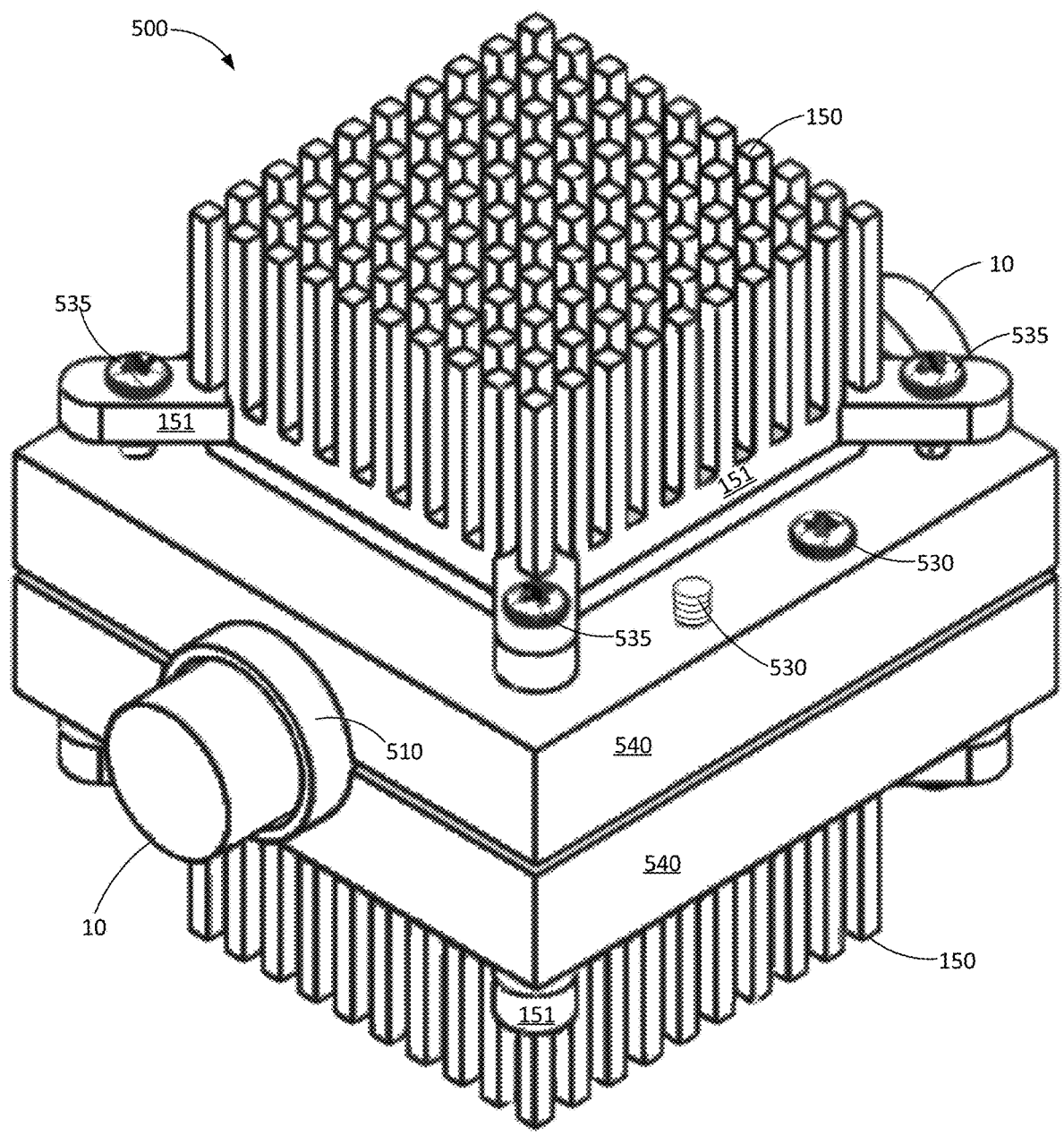
FIG. 11 is a perspective view illustrating the apparatus of FIG. 9.

Now referring to FIGS. 9-11, there is shown another embodiment of an apparatus with two heat sinks 150 and thus two thermoelectric generators 120, namely the apparatus 500. The apparatus 500 can be compared to the apparatus 200 shown in FIGS. 1-4, wherein the conductive strip 100 would be removed and replaced by another conductive body 140 with thermoelectric generator 120 and heat sink 150 thereon.

As shown in FIG. 11, the pipe 10 is surrounded by a first conductive body 540 at the top and a second conductive body 540 at the bottom. The pipe 10 is therefore firmly sandwiched between the pair of conductive bodies 540 which, together, surround the pipe 10 substantially completely. According to an embodiment, and as shown in FIGS. 9-11, a hollow portion can be provided within the conductive bodies 540 to form a circular contour 510 that partly surrounds the pipe 10 to capture the heat diffusing therefrom.

The conductive bodies 540 are secured together using attachments 530, shown as screws. The attachments 530 preferably provide a firm contact between the conductive bodies 540 to ensure a good thermal communication therebetween. Thermal paste can be added between both conductive bodies 540 to improve this thermal communication.

As for the apparatus 400, the apparatus 500 shown in FIGS. 9-11 comprises two heat sinks 150, each one of the heat sinks comprising a hat sink base 151 which is used to provide attachment. Indeed, as shown in FIGS. 9-11, the heat sink bases 151 are secured to the conductive bodies 540 using attachments 535, such as screws.

Having two heat sinks 150 and thus two thermoelectric generators 120 is advantageous in that it is easier to capture most of the heat originating from the pipe 10.

Having a greater number of thermoelectric generators 120 is therefore advantageous. FIGS. 12-16 illustrate another embodiment of an apparatus, namely the apparatus 600, where a greater number of thermoelectric generators 120 are provided around the pipe 10, thereby improving the heat capture. The plurality of conductive bodies 640, together, surround the pipe 10 substantially completely The apparatus 600 shown in FIGS. 12-13 comprises four heat sinks 150 and four thermoelectric generators 120. There are a plurality (i.e., four) of conductive bodies 640 which are provided on a portion of the pipe 10 and extend radially therefrom, thereby enlarging with the radial distance from the pipe. The conductive bodies 640 should extend radially far enough to reach a width that can accommodate a standard thermoelectric generator 120. The top surface of the conductive body 640 (i.e., the largest surface, which is the most radially distant from the pipe 10) is therefore adapted to accommodate a thermoelectric generator 120 within a TEG receptacle 620 (shown in FIG. 14); the remainder of the conductive body, as its name suggests, is to bring the heat originating from the pipe 10 to the thermoelectric generator 120.

Figure 12:
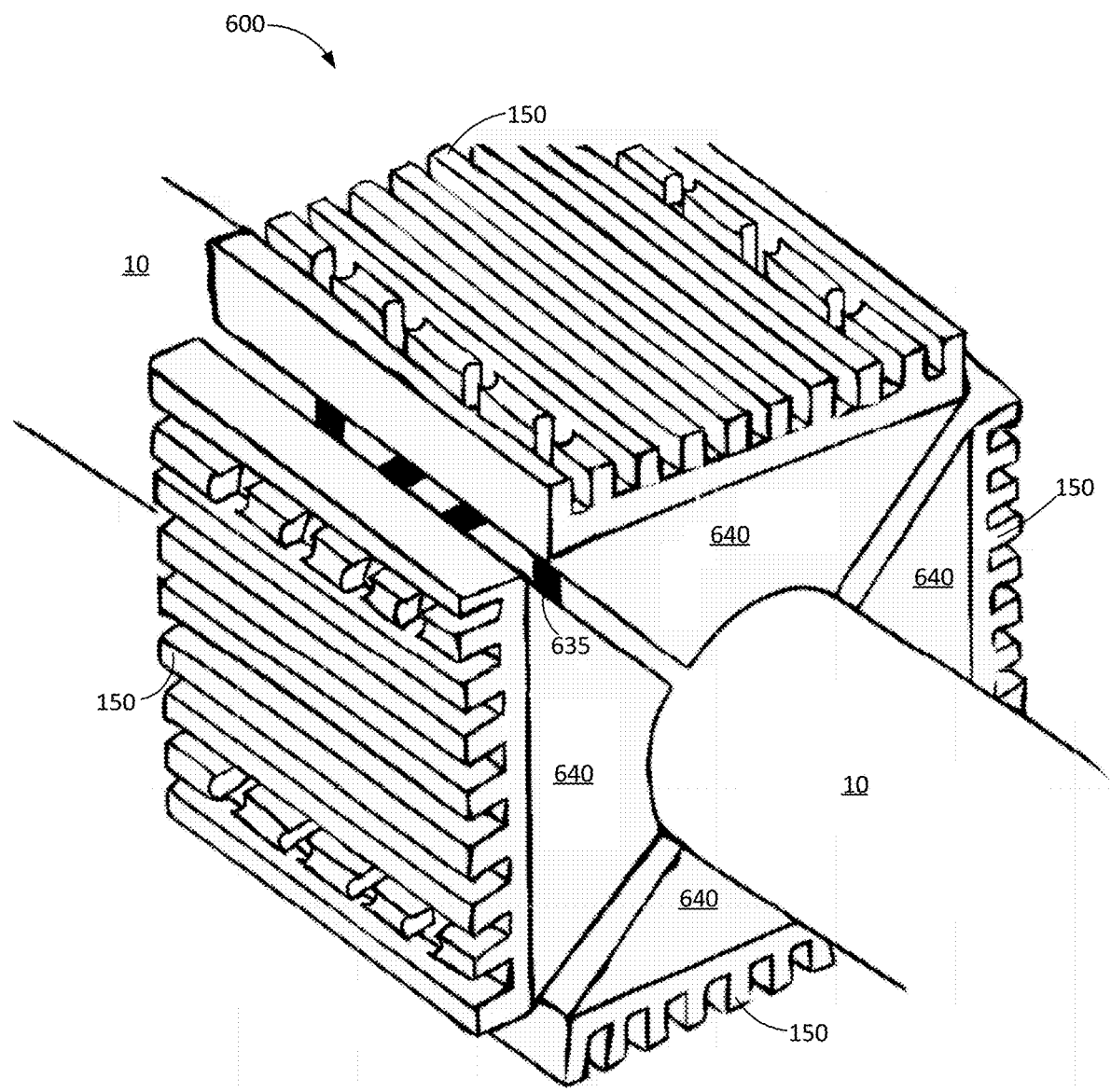
FIG. 12 is a perspective view illustrating an apparatus for converting heat dissipated from a pipe into electric power using four conductive bodies with a TEG receptacle and a heat sink mounted on each one of them, according to an embodiment.
Figure 13:
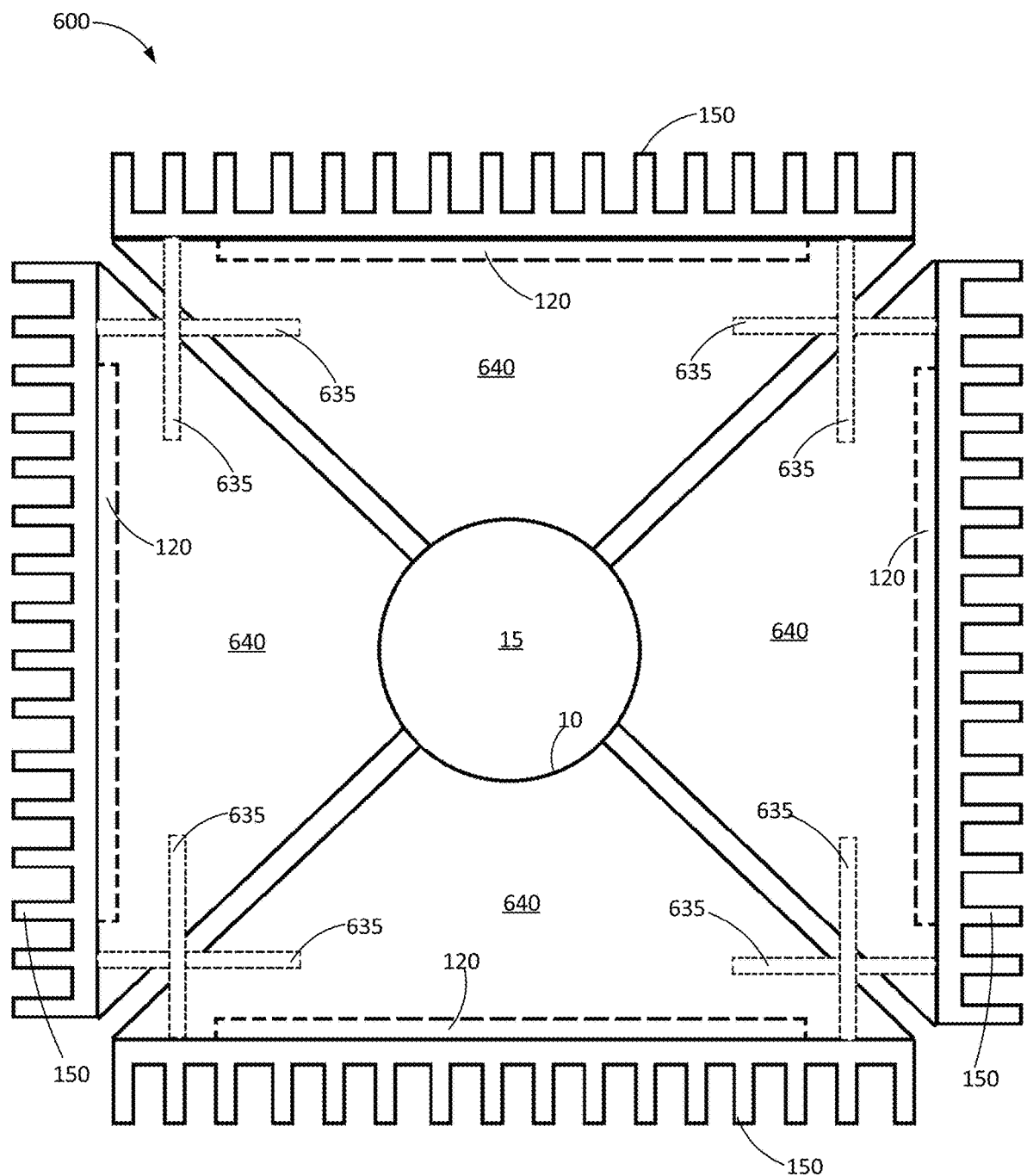
FIG. 13 is a side view illustrating the apparatus of FIG. 12.

In order to increase this heat transfer, a heat sink 150 is provided on top of each thermoelectric generator 120, as shown in FIGS. 12-13.

FIGS. 12-13 also illustrate how the conductive bodies 640 are attached together. Fasteners or attachments 635 are provided to ensure that the conductive bodies 640 are firmly secured together. The attachments 635 are shown as screws or pins that penetrate from one of the conductive bodies 640 to another one, thereby securing them together. These pins or screws are shown in FIG. 13. FIG. 12 also shows one set of these pins or screws as crossing the space between two conductive bodies 640. It further shows openings in each second row and second-to-last row of the heat sinks 150 where these pins or screws can be inserted. (These figures are exemplary in nature; other locations for the attachments 635 can be chosen, and the attachments 635 can be provided in a greater or smaller number.)

Figure 14:
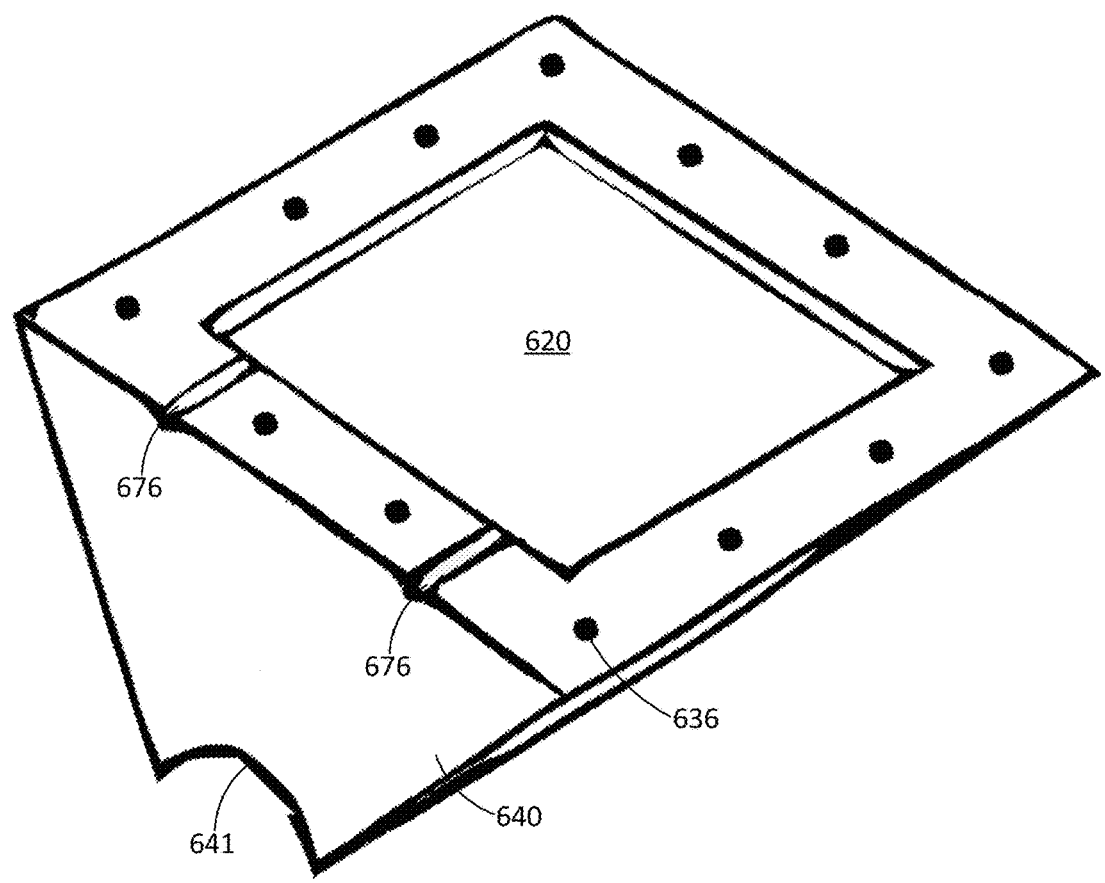
FIG. 14 is a perspective view illustrating a conductive body of the apparatus of FIG. 12, according to an embodiment.

FIG. 14 shows a conductive body 640, wherein its radially extending shape can be appreciated. The TEG receptacle 620 is shown on the top of the conductive body 640. Electric wire apertures or channels 676 are provided to let electric wires extend from the thermoelectric generator 120, where an electric connection must be provided. Attachment holes 636 are provided to let the attachments 635 pass therethrough. If the attachments (not shown) adapted for use with attachment holes 636 are screws or pins as shown in FIG. 13, the attachments holes 636 are small tunnels which let the pins or screws reach another adjacent conductive body 640.

Figure 15A:
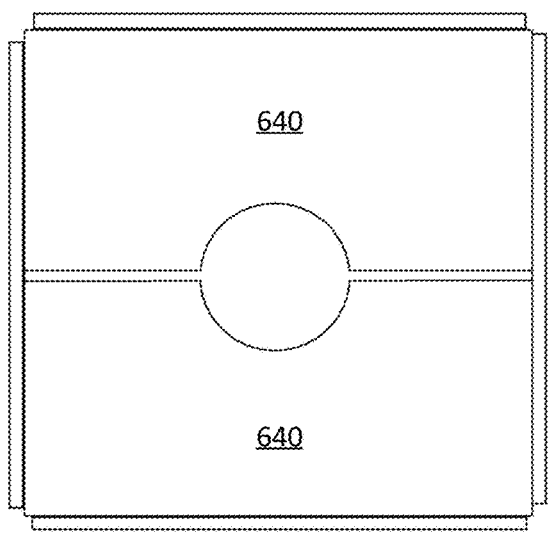
FIGS. 15A-15B are side views illustrating other embodiments of a conductive body for the apparatus of FIG. 12.
Figure 15B:
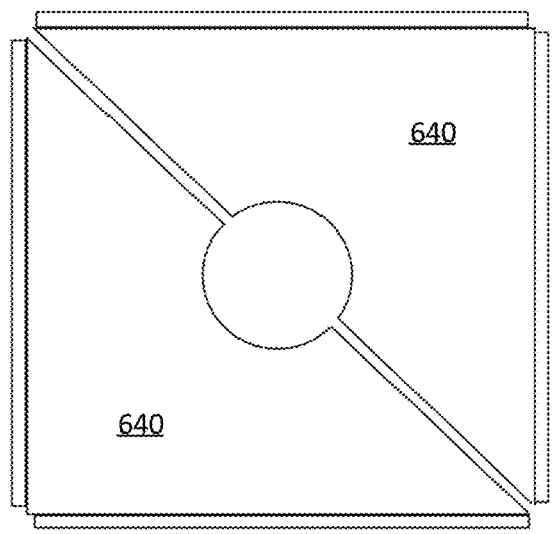

It should be noted that a conductive body 640 can be provided in another shape or configuration, as shown in FIGS. 15A-15B. In these cases, a thermoelectric generator can be shared by different conductive bodies (as shown in FIG. 15A), or more than one thermoelectric generators 120 can be mounted on a conductive body 640 (as shown in FIG. 15B).

Other components from the other apparatuses described herein can be added to the apparatus 600. For example, an insulating layer, in the shape of a rectangular ring, could be added under the heat sink 150 to prevent heat escape and to ensure most of the heat flows through a thermoelectric generator 120.

Figure 16:
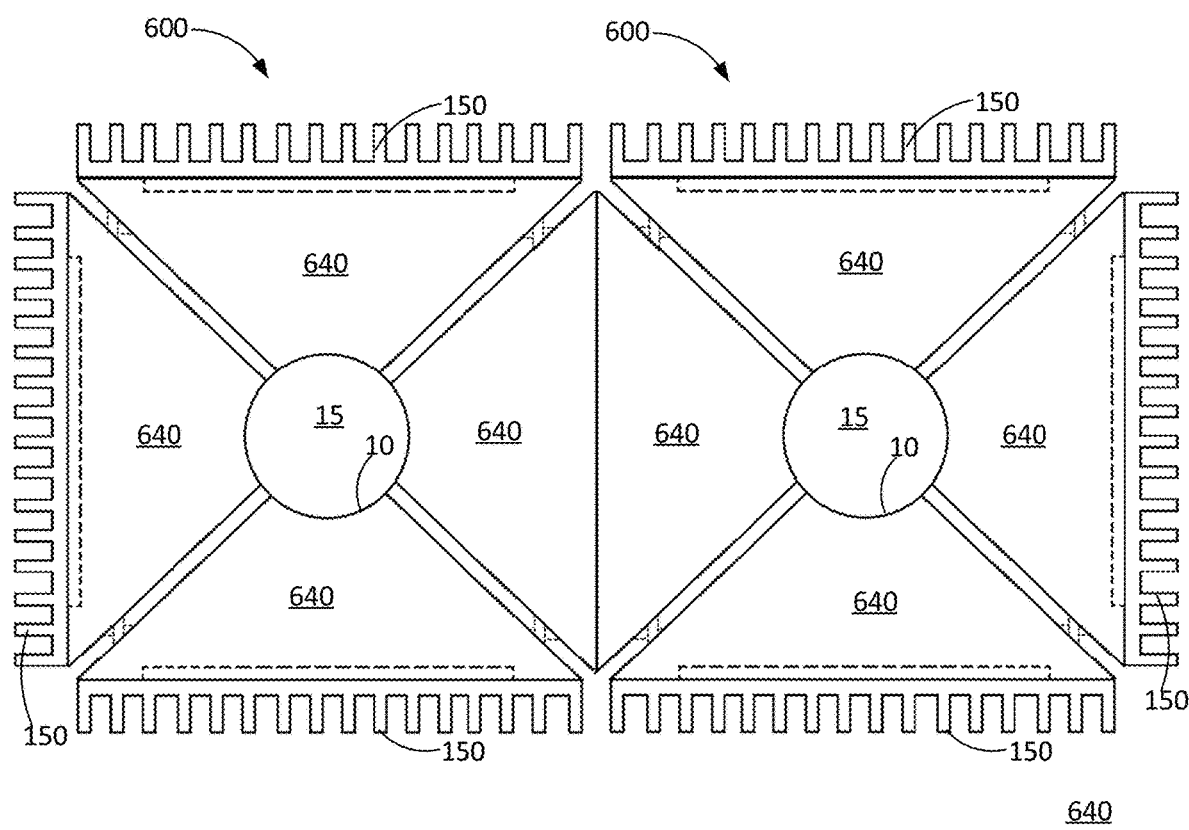
FIG. 16 is a side view illustrating two of the apparatuses of FIG. 12 in a parallel multi-pipe configuration, according to an embodiment.

This embodiment also allows for a multi-pipe configuration, as shown in FIG. 16, in which more than one pipes 10 are provided side-by-side with space therebetween. Heat that is directed in this in-between space is captured by one or more conductive bodies 640 and eventually transferred to another conductive body 640 with a thermoelectric generator 120 thereon. It should be noted that in the embodiment shown in FIG. 16, both apparatuses 600 which are provided side-by-side are modified in that the thermoelectric generator 120 and heat sink 150 that would face the neighboring apparatus are removed for simplicity, and to allow heat conduction to the thermoelectric generators which are still provided on the other surfaces, While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. An apparatus for converting heat dissipated from a pipe of a refrigeration cycle into electric power, the pipe having an outer surface from which the heat dissipates, the apparatus comprising:
more than two thermoelectric generator (TEG) receptacles, each being distinct and separate and having sides and a corresponding bottom surface being wholly flat and straight along a corresponding single receptacle plane for seating a corresponding thermoelectric generator therein, the corresponding thermoelectric generator of each of the more than two TEG receptacles being wholly straight and having a corresponding top TEG surface, and a corresponding bottom TEG surface extending only in a single TEG plane along the whole corresponding bottom TEG surface of which a respective normal axis, perpendicular to both the single receptacle plane and to the single TEG plane which corresponds thereto, extends radially from the pipe such that the more than two TEG receptacles together surround the pipe, away from the pipe, while the corresponding bottom surface each of the more than two TEG receptacles is wholly flat, each TEG receptacle comprising a cold side oriented away radially from the pipe and a hot side oriented radially toward the pipe;
more than two conductive bodies, each corresponding to the more than two TEG receptacles, each in thermal contact with at least a portion of the outer surface of the pipe and adapted to conduct the heat from the outer surface of the pipe to the hot side of a corresponding one of the more than two TEG receptacles, each one of the more than two conductive bodies having two distinct, separate adjacent ones of the more than two conductive bodies;
more than two heat sinks, each in thermal contact with the cold side of a corresponding one of the more than two TEG receptacles and to be positioned over the corresponding top TEG surface and, along with the corresponding bottom surface and corresponding sides of the corresponding one of the more than two TEG receptacles, for enclosing the corresponding thermoelectric generator therein; and
a plurality of attachments, each one for securing a given one of the heat sinks with a corresponding one of the more than two TEG receptacles and simultaneously for securing together a corresponding one of the more than two conductive bodies with one of the two distinct, separate adjacent ones of the more than two conductive bodies thereof.

2. The apparatus of claim 1, wherein the plurality of attachments ensure an intimate contact between the more than two conductive bodies and the outer surface of the pipe.

3. The apparatus of claim 2, wherein each one of the attachments further provides an intimate contact between adjacent ones of the more than two conductive bodies.

4. The apparatus of claim 2, further comprising a thermoelectric generator installed in each one of the more than two TEG receptacles.

5. The apparatus of claim 2, wherein each one of the more than two TEG receptacles comprises a pair of channels for letting electric wires pass therethrough.

6. The apparatus of claim 2, wherein the more than two conductive bodies comprise four conductive bodies, the pipe being sandwiched between the four conductive bodies which, together, surround the outer surface of the pipe.

7. The apparatus of claim 6, wherein the more than two TEG receptacles comprise four TEG receptacles and the more than two heat sinks comprise four heat sinks, each one of the four conductive bodies is in thermal contact with one of the four TEG receptacles which is in thermal contact with one of the four heat sinks.

8. The apparatus of claim 7, wherein each of the plurality of attachments further provides an intimate contact between a given one of the four conductive bodies and one of the two adjacent conductive bodies thereof, and the plurality of attachments together assist in forcing the four conductive bodies to surround the outer surface of the pipe and to firmly sandwich the pipe therebetween.

9. The apparatus of claim 1, wherein each of the plurality of attachments comprises at least one of a screw and a pin, each of the plurality of attachments being inserted through one of the heat sinks, through the more than two TEG receptacles and through at least two of the more than two conductive bodies.

10. The apparatus of claim 1, wherein the plurality of attachments are separate and distinct from each other.

11. An apparatus for converting heat dissipated from a pipe of a refrigeration cycle into electric power, the pipe having an outer surface from which the heat dissipates, the apparatus comprising:

more than two thermoelectric generator (TEG) receptacles, each for seating a corresponding thermoelectric generator therein, each TEG receptacle comprising a cold side and a hot side on which the corresponding thermoelectric generator is to be seated;

more than two conductive bodies which together surround the pipe, each corresponding to the more than two TEG receptacles, each in thermal contact with at least a portion of the outer surface of the pipe and adapted to conduct the heat from the outer surface of the pipe to the hot side of a corresponding one of the more than two TEG receptacles, each one of the more than two conductive bodies having two distinct, separate adjacent ones of the more than two conductive bodies, the two distinct, separate adjacent ones of the more than two conductive bodies being distinct and separate from each other;

more than two heat sinks, each in thermal contact with the cold side of a corresponding one of the more than two TEG receptacles and to be positioned over a corresponding top TEG surface of the corresponding thermoelectric generator seated therein and, together with a bottom and sides of the corresponding one of the more than two TEG receptacles, for enclosing the corresponding thermoelectric generator therein; and a plurality of distinct and separate attachments;

wherein the more than two conductive bodies are pierced with attachment holes, the attachment holes forming at least a pair of attachment holes of adjacent ones of the more than two conductive bodies, and through each pair of attachment holes of adjacent ones of the more than two conductive bodies, a single one of the plurality of distinct and separate attachments extends through for securing together a corresponding one of the more than two conductive bodies with one of the two distinct, separate adjacent ones of the more than two conductive bodies thereof, each one of the plurality of distinct and separate attachments simultaneously securing a given one of the heat sinks with a corresponding one of the more than two TEG receptacles.

* * * * *